(12) United States Patent
Khazhinsky et al.

(10) Patent No.: US 7,301,741 B2
(45) Date of Patent: Nov. 27, 2007

(54) INTEGRATED CIRCUIT WITH MULTIPLE INDEPENDENT GATE FIELD EFFECT TRANSISTOR (MIGFET) RAIL CLAMP CIRCUIT

(75) Inventors: Michael G. Khazhinsky, Austin, TX (US); Leo Mathew, Austin, TX (US)

(73) Assignee: Freescale Semiconductor, Inc.

( * ) Notice: Subject to any disclaimer, the term of this patent is extended or adjusted under 35 U.S.C. 154(b) by 373 days.

(21) Appl. No.: 11/130,873

(22) Filed: May 17, 2005

(65) Prior Publication Data
US 2006/0262469 A1    Nov. 23, 2006

(51) Int. Cl.
*H02H 3/22* (2006.01)
(52) U.S. Cl. .......................................... 361/56; 361/111
(58) Field of Classification Search .................. 361/56, 361/91.1, 111
See application file for complete search history.

(56) References Cited

U.S. PATENT DOCUMENTS

| | | | |
|---|---|---|---|
| 4,385,337 A | 5/1983 | Asano et al. | |
| 5,034,845 A | 7/1991 | Murakami | |
| 5,237,395 A | 8/1993 | Lee | |
| 5,239,440 A | 8/1993 | Merrill | |
| 5,255,146 A | 10/1993 | Miller | |
| 5,287,241 A | 2/1994 | Puar | |
| 5,311,391 A | 5/1994 | Dungan et al. | |
| 5,361,185 A | 11/1994 | Yu | |
| 5,440,162 A | 8/1995 | Worley et al. | |
| 5,515,232 A | 5/1996 | Fukazawa et al. | |
| 5,559,659 A | 9/1996 | Strauss | |
| 5,610,790 A | 3/1997 | Staab et al. | |
| 5,654,862 A | 8/1997 | Worley et al. | |
| 5,946,177 A | 8/1999 | Miller et al. | |
| 6,385,021 B1 | 5/2002 | Takeda et al. | |
| 6,714,061 B2* | 3/2004 | Hareland | 327/310 |
| 6,724,603 B2 | 4/2004 | Miller et al. | |
| 7,075,132 B1* | 7/2006 | Lin et al. | 257/256 |

(Continued)

OTHER PUBLICATIONS

W.D. Mack and R.G. Meyer, "New ESD Protection Schemes for BiCMOS Processes with Application to Cellular Radio Designs," ISCAS Proceedings 1992.

(Continued)

*Primary Examiner*—Michael Sherry
*Assistant Examiner*—Danny Nguyen
(74) *Attorney, Agent, or Firm*—Larson Newman Abel Polansky & White, LLP

(57) ABSTRACT

A rail clamp circuit (100) includes first and second power supply voltage rails, a multiple independent gate field effect transistor (MIGFET) (128), and an ESD event detector circuit (138). The MIGFET (128) has a source/drain path coupled between the first (112) and second (114) power supply voltage rails, and first and second gates. The ESD event detector circuit (138) is coupled between the first (112) and second (114) power supply voltage rails, and has first and second output terminals respectively coupled to the first and second gates of the MIGFET. In response to an electrostatic discharge (ESD) event between the first (112) and second (114) power supply voltage rails, the ESD event detector circuit (138) provides a voltage to the second gate to lower an absolute threshold voltage of the MIGFET (128) while providing a voltage to the first gate above the absolute threshold voltage so lowered, thereby making the MIGFET (128) conductive with relatively high conductivity.

20 Claims, 2 Drawing Sheets

U.S. PATENT DOCUMENTS

| | | |
|---|---|---|
| 2003/0151077 A1 | 8/2003 | Mathew et al. |
| 2004/0219722 A1 | 11/2004 | Pham et al. |
| 2004/0235300 A1 | 11/2004 | Mathew et al. |

OTHER PUBLICATIONS

E. R. Worley, R. Gupta, B. Jones, R. Kjar, C. Nguyen, and M. Tennyson, "Sub-micron Chip ESD Protection Schemes which Avoid Avalanching Junctions," Proc. EOS/ESD Symposium, pp. 13-20, 1995.

G. Croft, "Transient Supply Clamp with a Variable RC Time Constant," EOS/ESD Symp. Proceedings, 1996, pp. 276-279.

W. Anderson, J. Montanaro and N Howorth, "Cross-Referenced ESD Protection for Power Supplies," EOS/ESD Symp. Proceedings, 1998.

J.C. Bernier, G.D. Croft, and W.R. Young, "A Process Independent ESD Design Methodology," ISCAS Proceedings, 1999.

Richard Merrill and Enayet Issaq, "ESD Design Methodology," National Semiconductor Fairchild Research Center, EOS/ESD Symposium, 1993.

Cynthia A. Torres et al. "Modular, Portable, and Easily Simulated ESD Protection Networks for Advanced CMOS Technologies,," Motorola, Inc.

Michael Stockinger et al. "Boosted and Distributed Rail Clamp Networks for ESD Protection in Advanced CMOS Technologies," EOS/ESD Symposium, Motorola, Inc., 1993.

Patrick A. Juliano and Warren R. Anderson ESD Protection Design Challenges for a High Pin-Count Alpha Microprocessor in a 0.13 um CMOS SOI Technology, EOS/ESD Symposium, Motorola, Inc., 1993.

Gen Pei and Edwin Chih-Chuan Kan, "Independently Driven DG MOSFETs for Mixed-Signal Circuits: Part I—Quasi-Static and Nonquasi-Static Channel Coupling," IEEE Transactions, vol. 51, No. 12, Dec. 2004.

Gen Pei and Edwin Chih-Chuan Kan, "Independently Driven DG MOSFETs for Mixed-Signal Circuits: Part II—Applications on Cross-Coupled Feedback and Harmonics Generation," IEEE Transactions, vol. 51, No. 12, Dec. 2004.

\* cited by examiner

INTEGRATED CIRCUIT WITH MULTIPLE INDEPENDENT GATE FIELD EFFECT TRANSISTOR (MIGFET) RAIL CLAMP CIRCUIT

FIELD OF THE DISCLOSURE

The invention relates generally to integrated circuits, and more particularly to electrostatic discharge (ESD) protection circuits for integrated circuits.

BACKGROUND

Complementary metal-oxide-semiconductor (CMOS) integrated circuits (ICs) are susceptible to damage when exposed to an electrostatic discharge (ESD) event. An ESD event may occur, for example, when a user who has accumulated electrostatic charge picks up a CMOS IC. The accumulated charge may cause an instantaneous voltage of a few thousand volts to appear across terminals of the IC. This voltage is large enough to cause permanent damage to CMOS transistors, such as by rupturing the gates of the transistors. Thereafter, the CMOS IC cannot function properly.

In order to prevent the damage caused by an ESD event, CMOS IC designers include ESD protection circuits adjacent to input and/or output IC terminals. These circuits typically include diodes to discharge a large voltage appearing on a signal terminal into a power supply terminal.

It is also important for ESD protection circuits to include power supply voltage rail clamps. These rail clamps are designed to quickly dissipate a voltage between the power and ground power supply voltage terminals built up during an ESD event. One known rail clamp circuit uses a conventional low voltage CMOS transistor and a trigger circuit that makes the low voltage CMOS transistor conductive during an ESD event to short the power and ground rails. While low voltage CMOS transistors are highly conductive during an ESD event, they suffer from relatively high leakage current during normal operation. A known alternative rail clamp circuit uses a dual gate oxide (DGO) transistor instead of the low voltage CMOS transistor. While the DGO transistor exhibits relatively low leakage during normal operation due to its high threshold voltage, it suffers from low conductivity when made to be conductive during an ESD event. Thus neither conventional low voltage transistors nor DGO transistors are ideal for an ESD rail clamp circuit.

What is needed then is an ESD protection circuit that has both relatively low leakage during normal operation and relatively high conductivity during an ESD event.

BRIEF DESCRIPTION OF THE DRAWINGS

The present disclosure may be better understood, and its numerous features and advantages made apparent to those skilled in the art by referencing the accompanying drawing, in which like reference numbers indicate similar or identical items.

DETAILED DESCRIPTION

Figure 1:
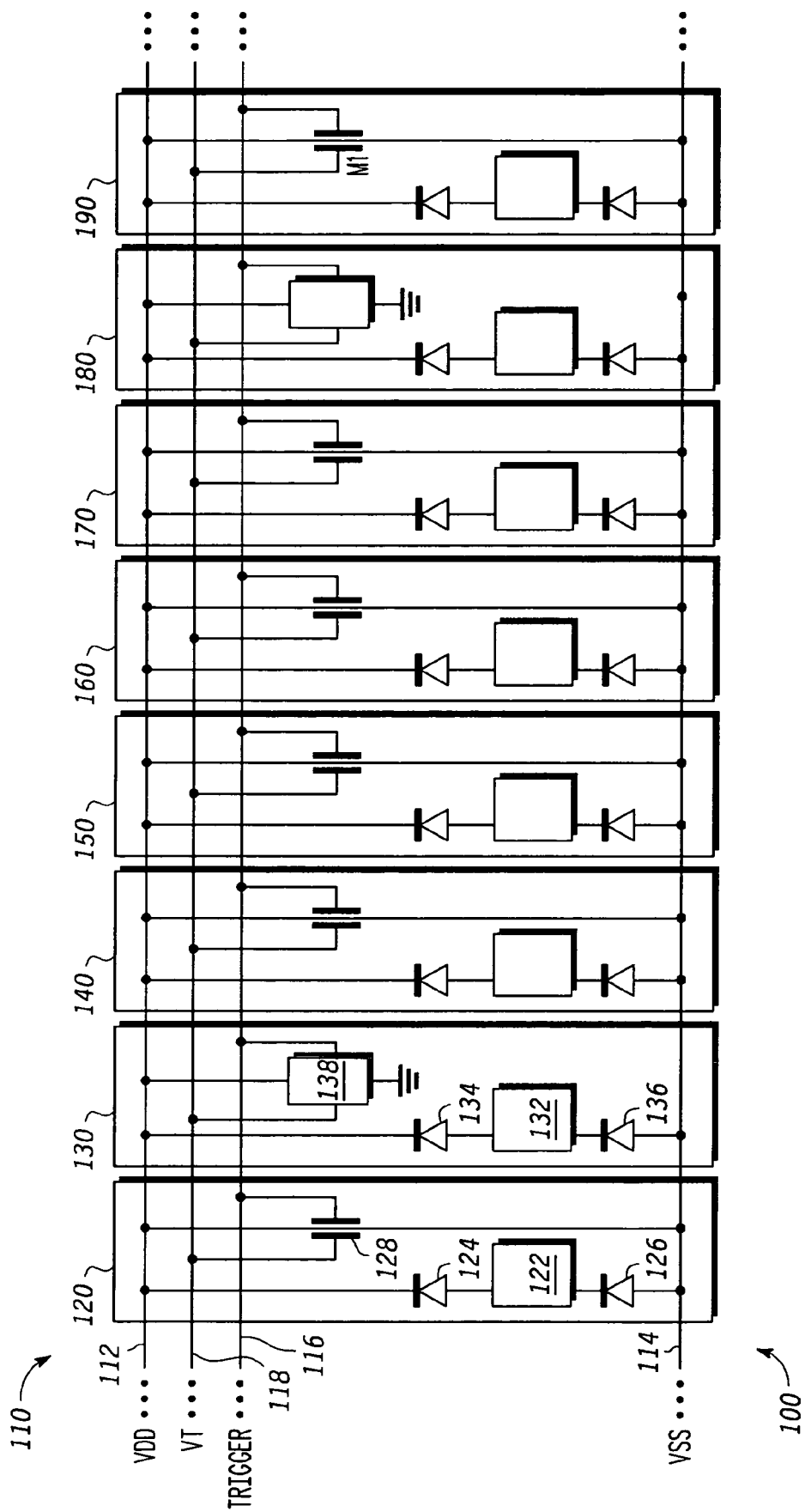
FIG. 1 illustrates in partial block diagram and partial schematic form a portion of an integrated circuit having a rail clamp circuit using a multiple independent gate field effect transistor (MIGFET) according to the present invention.

In one form a rail clamp circuit is adapted for use with a plurality of external terminals of an integrated circuit that may be exposed to an electrostatic discharge (ESD) event. The rail clamp circuit includes a first power supply voltage rail, a second power supply voltage rail, a multiple independent gate field effect transistor (MIGFET), and an ESD event detector circuit. The MIGFET has a source/drain path coupled between the first and second power supply voltage rails, a first gate, and a second gate. The ESD event detector circuit is coupled between the first and second power supply voltage rails, and has first and second output terminals respectively coupled to the first and second gates of the MIGFET. In response to an ESD event between the first and second power supply voltage rails, the ESD event detector circuit provides a voltage to the first gate to adjust a threshold voltage of the MIGFET while providing a voltage to the second gate to make the MIGFET conductive with relatively high conductivity.

According to one aspect of the rail clamp circuit the MIGFET may be formed above a substrate of the integrated circuit, and may also have a vertical channel in which the current flows horizontally with respect to the substrate. Such a MIGFET may also have electrically isolated gate electrode regions on opposite sides of the vertical channel forming the first gate and the second gate. In various embodiments the MIGFET may be an N-channel MIGFET in which case the ESD event detector adjusts the threshold voltage by lowering the threshold voltage, or a P-channel MIGFET in which case the ESD event detector adjusts the threshold voltage by raising the threshold voltage.

In another form, an integrated circuit includes a first power supply voltage rail, a second power supply voltage rail, a trigger signal rail, a VT signal rail, a plurality of first input/output cells, and an ESD event detector circuit. The plurality of first input/output cells is located adjacent to the first and second power supply voltage rails. Each of the plurality of first input/output cells includes a multiple independent gate field effect transistor (MIGFET) having a source-drain path coupled between the first and second power supply voltage rails, and having first and second gates respectively coupled to the VT signal rail and the trigger signal rail. The ESD event detector circuit is coupled between the first and second power supply voltage rails, and has first and second output terminals respectively coupled to the trigger signal rail and to the VT signal rail. In response to an electrostatic discharge (ESD) event between the first and second power supply voltage rails, the ESD event detector circuit provides a voltage to the VT signal rail to adjust a threshold voltage of the MIGFET of each of the plurality of first input/output cells while providing a voltage to the trigger signal rail to make the MIGFET conductive with relatively high conductivity.

According to one aspect of such an integrated circuit each of the plurality of input/output cells comprises a bonding pad. According to a further aspect of this integrated circuit each input/output cell further comprises a first diode coupled between the bonding pad and the first power supply voltage rail, and a second diode coupled between the second power supply voltage rail and the bonding pad.

According to another aspect the integrated circuit further comprises at least one second input/output cell comprising the ESD event detector. The integrated circuit may further comprise a plurality of such second input/output cells, each comprising an ESD event detector. In this case the plurality of second input/output cells may be interspersed with the plurality of first input/output cells. In one particular embodiment, the ratio of the plurality of first input/output cells and the plurality of second input/output cells occur in the ratio of about five to one.

According to yet another aspect of this integrated circuit the trigger signal rail is narrower than either the first power supply voltage rail or the second power supply voltage rail. Likewise according to still another aspect of this integrated circuit, the VT signal rail may be narrower that either the first power supply voltage rail or the second power supply voltage rail.

In yet another form, there is provided a method of protecting an integrated circuit from an electrostatic discharge (ESD) event. A multiple independent gate field effect transistor (MIGFET) is coupled between first and second power supply voltage rails. During normal operation, a first gate of the MIGFET is biased to select a relatively low leakage and a second gate of the MIGFET is biased to make the MIGFET nonconductive with the relatively low leakage. During the ESD event, the first gate of the MIGFET is biased to select a relatively low threshold voltage and the second gate of the MIGFET is biased to make the MIGFET conductive with the relatively high conductivity.

According to one aspect of this method the step of biasing the first gate of the MIGFET during the ESD event may comprise the steps of detecting the ESD event and triggering the MIGFET to be conductive with the relatively high conductivity in response to the step of detecting. The step of triggering the MIGFET may comprise the step of providing a trigger signal to the first gate of the MIGFET in response to the step of detecting. Furthermore the step of coupling the MIGFET between the first and second power supply voltage rails may comprise the step of coupling an N-channel MIGFET between the first and second power supply voltage rails, and the step of biasing the first gate of the MIGFET during the ESD event to select the relatively high conductivity may comprise the step of lowering a threshold voltage of the N-channel MIGFET. Also the step of coupling the MIGFET between the first and second power supply voltage rails may comprise the step of coupling a P-channel MIGFET between the first and second power supply voltage rails, and the step of biasing the first gate of the MIGFET during the ESD event to select the relatively high conductivity may comprise the step of raising a threshold voltage of the P-channel MIGFET.

FIG. 1 illustrates in partial block diagram and partial schematic form a portion of an integrated circuit 100 having a rail clamp circuit using a multiple independent gate field effect transistor (MIGFET) 128 according to the present invention. IC 100 includes generally a set of conductors 110 and input/output cells 120-190. Conductors 110 include a power supply voltage rail 112 for conducting a power supply voltage labeled "VDD", a power supply voltage rail 114 for conducting a power supply voltage labeled "VSS", a trigger signal rail 116 for conducting a control signal labeled "TRIGGER", and a VT signal rail 118 for conducting a control signal labeled "VT". VDD is a more positive power supply voltage having a nominal value of about 2.5 volts, but may be any other common power supply voltage level. VSS is a ground power supply voltage having a nominal value of about 0.0 volts.

Conductors 110 are routed through each of I/O cells 120-190. I/O cell 120 is representative of cells 120, 140-170, and 190 and includes a bonding pad 122, diodes 124 and 126, and MIGFET 128. Note that as used herein, "bonding pad" refers to an interconnection terminal to external circuitry regardless whether the interconnection is formed by wire bonds, ball bonds, or some other form of interconnection. I/O cell 120 includes a driver circuit that forms a last stage of an output buffer providing an output signal on bonding pad 122, and an input buffer receiving a voltage from bonding pad 122, neither of which are shown in FIG. 1. Diode 124 has a positive terminal connected to bonding pad 122, and a negative terminal connected to power supply rail 112. Diode 126 has a positive terminal connected to power supply rail 114, and a negative terminal connected to bonding pad 122. MIGFET 128 is an N-channel MIGFET and includes a first source/drain terminal connected to power supply rail 112, a second source/drain terminal connected to power supply rail 114, a first gate connected to conductor 116 for receiving the TRIGGER signal therefrom, and a second gate connected to conductor 118 for receiving the VT signal therefrom.

I/O cell 130 is representative of cells 130 and 180 and includes a bonding pad 132, diodes 134 and 136, and a ESD event detector circuit 138. Cell 130 includes a driver circuit that forms a last stage of an output buffer providing an output signal on bonding pad 132, and an input buffer receiving a voltage from bonding pad 132, neither of which are shown in FIG. 1. Diode 134 has a positive terminal connected to bonding pad 132, and a negative terminal connected to power supply rail 112. Diode 136 has a positive terminal connected to power supply rail 114, and a negative terminal connected to bonding pad 132. ESD event detector circuit 138 has a positive terminal connected to power supply rail 114, a negative terminal connected to power supply rail VSS, a first output terminal for providing the TRIGGER signal, and a second output terminal for providing the VT signal.

I/O cells 120-190 are part of a larger group of I/O cells that may form, for example, an input/output port of a microcontroller. Note that as used herein, "input/output" means input-only, output-only, or input and output. The ESD protection circuitry includes two mechanisms: the discharge diodes and the rail clamp circuit. In response to a high voltage appearing on a bonding pad such as bonding pad 122, one of diodes 124 and 126 become forward biased to dissipate the voltage into the appropriate power supply rail. For example if a large positive voltage appears on bonding pad 122, diode 124 would become forward biased and dissipate the voltage by transferring the electrostatic charge onto supply rail 112.

The other ESD mechanism is the rail clamp circuit. The rail clamp circuit dissipates a large voltage that may appear between rail 112 and rail 114 during an ESD event. Any of a number of ESD event detector circuits such as circuit 138 detects a sharp increase in voltage between the supply conductors during an ESD event. Circuit 138 is conventional and may be formed by, for example, the series combination of a resistor and a capacitor between rail 112 and rail 114. The interconnection point between the resistor and the capacitor then indicates the presence of an ESD event. However in one embodiment the circuit is formed using the technique disclosed in FIG. 7 of U.S. Patent Publication No. 20040109270A1, published Jun. 10, 2004, entitled "Transient Detection Circuit", invented by Michael Stockinger et al. Circuit 138 then activates two output signals, TRIGGER and VT, in response to an ESD event. Circuit 138 may provide these signals at different voltage levels, as will be explained further with reference to FIG. 3, below.

In response to the activation of the TRIGGER signal after an ESD event, MIGFETs like MIGFET 128 become conductive. In response to the activation of the VT signal after an ESD event, the threshold voltage of MIGFETS like MIGFET 128 is lowered, thereby making the MIGFET conductive with relatively high conductivity. As a result, the rail clamp circuit exhibits low leakage during normal operation, and high conductivity during ESD mode. By using MIGFETs, the ESD rail clamp circuit provides a simple, modular, and portable ESD protection circuit using commonly available low voltage transistors and that is achievable using circuit design techniques in processes in which MIGFETs are available. Alternatively, the rail clamp circuit can be used to provide significant area savings while keeping leakage current at or below that of a comparable low voltage CMOS transistor and ESD mode conductivity at or higher than a comparable DGO transistor.

Figure 2:
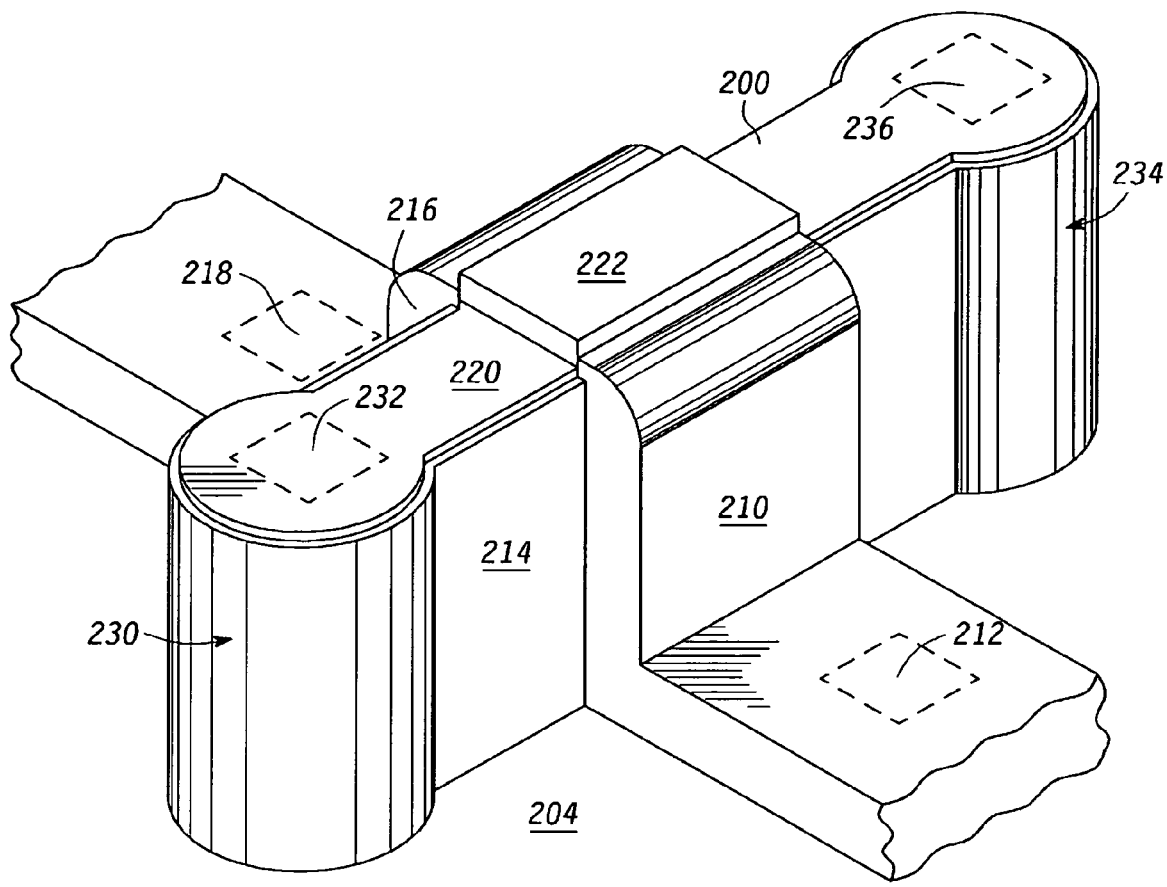
FIG. 2 illustrates a perspective view of a MIGFET that may be used in the rail clamp circuit of FIG. 1.

To explain the operation of circuit 100 better, reference is now made to FIG. 2, which illustrates a perspective view of a MIGFET 200 that may be used in the rail clamp circuit of FIG. 1. MIGFET 200 is formed on an insulating layer 204 overlying a semiconductor substrate and includes a vertical (with respect to the plane of the substrate) channel region surrounded on the right side by a gate structure 210 having a gate contact region 212 and separated from the vertical channel by a vertical gate dielectric 214, and on a left side by a gate structure 216 having a gate contact region 218 and separated from the vertical channel by a vertical gate dielectric that is not specifically illustrated in FIG. 2. Gate regions 210 and 216 are electrically isolated from each other by a dielectric layer 220 and an overlying nitride layer 222. A first source/drain structure 230 on one end of the vertical channel includes a source/drain contact region 232, and a second source/drain structure 234 on the other end of the vertical channel includes a source/drain contact region 236. Current flows horizontally with respect to the plane of the substrate from the source region to the drain region (one of source/drain regions 232 and 236 to the other one of source/drain regions 232 and 236, depending on the voltages applied).

One process that may be used to form MIGFET 200 is disclosed in U.S. Patent Application Publication No. US 2004/0235300 A1, published Nov. 25, 2004, entitled "Transistor with Independent Gate Structures," invented by Leo Mathew et al. and assigned to the assignee hereof. Note that this structure may be formed as part of a silicon-on-insulator process or as additional steps in a conventional CMOS process.

MIGFET 200 has certain characteristics that make it useful in an ESD rail clamp circuit. It allows dynamic VT control by proper biasing of one of the gates. It provides very low leakage, extending the scalability of CMOS processes to much smaller device geometries. The dual channel nature of the MIGFET and mobility enhancement provides high drive currents needed to dissipate an ESD event.

Figure 3:
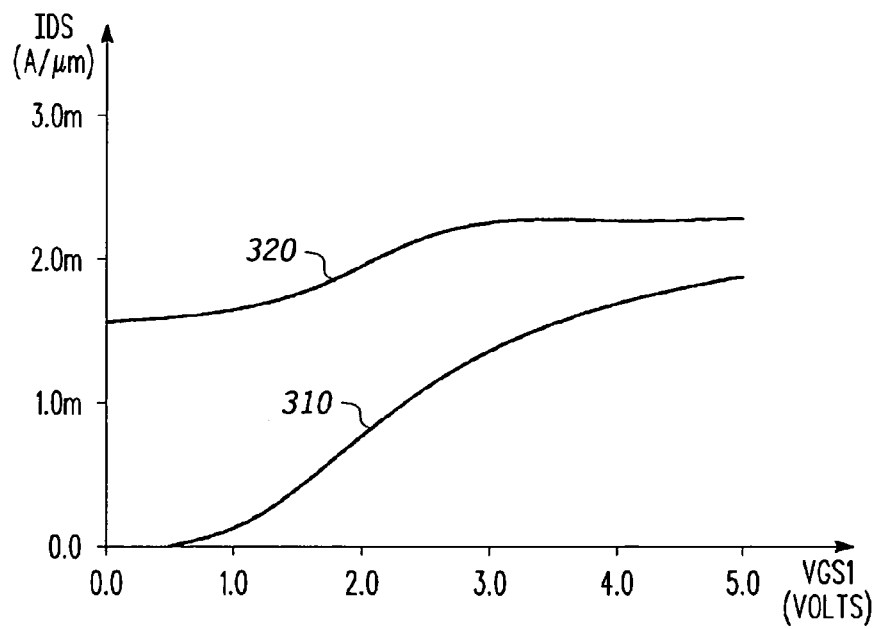
FIG. 3 illustrates a graph showing a Vgs/Ids characteristic of the MIGFET of FIG. 2.

One especial characteristic of MIGFET 200 that makes it useful in IC 100 is further described with reference to FIG. 3, which illustrates a graph showing two Vgs/Ids characteristics of MIGFET 200 of FIG. 2. In FIG. 3 the horizontal axis represents gate-to-source voltage with respect to the first gate (Vgs1) in volts, and the vertical axis represents drain-to-source current. (Ids), expressed as a current density in amperes per micron (A/μm). A first Vgs/Ids characteristic corresponding to normal operation in which the voltage on the second gate (designated "Vgs2") is set to 0.0 volts and is shown as 310, whereas a second Vgs/Ids characteristic corresponding to ESD mode in which Vgs2 is set to 2.0 volts is shown as 320. Thus it can be seen that by modulating the voltage on the second gate of MIGFET 200, the conductivity can be significantly increased during ESD mode.

Returning now to FIG. 1, note that I/O cells having MIGFETS like I/O cell 120 are interspersed with I/O cells having ESD event detector circuits like I/O cell 130. As shown the ratio between the two types of I/O cells is 5:1. By interspersing the I/O cells having MIGFETs with the I/O cells having ESD event detector circuits, integrated circuit 100 provides high ESD protection while maintaining compact layout. Note that it is also possible to separate the ESD event detector circuit into a first type in one I/O cell that activates the TRIGGER signal and a second type in another I/O cell that activates the VT signal. Note that since the ESD event detector circuits only convey biasing signals to other input/output cells, trigger signal rail 116 and VT signal rail 118 may be made relatively smaller than power supply rail 112 and ground rail 114.

In an alternate embodiment, the two gates of the MIGFETs may be connected together, either by eliminating those portions of nitride layer 222 and dielectric layer 220 between gate structures 210 and 216 to form a continuous gate on both sides of the vertical channel, or by connecting the two separate gate structures together using a separate conductor such as polysilicon. This special type of MIGFET is designated a "FinFET". In this case during an ESD event, the first and second gates would be biased to the same voltage above the threshold voltage, causing an increase in conductivity of the FinFET during the ESD event as for the generic MIGFET, but restricting the family of Vgs/Ids curves to the ones in which Vgs1=Vgs2.

Note that in another alternate embodiment N-channel MIGFET 128 may be replaced by a comparable P-channel MIGFET. In the case of a P-channel MIGFET, the ESD event detector circuits would need to provide comparable negative gate-to-source voltages on the two gates of the MIGFET. It should be apparent that regardless of the conductivity type of the MIGFET, the ESD event detector circuit biases the second gate to give the MIGFET relatively low leakage during normal operation and relatively high conductivity in response to the ESD event.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. For use with a plurality of external terminals of an integrated circuit that may be exposed to an electrostatic discharge (ESD) event, a rail clamp circuit comprising:
   a first power supply voltage rail;
   a second power supply voltage rail;
   a multiple independent gate field effect transistor (MIGFET) having a source/drain path coupled between said first and second power supply voltage rails, a first gate and a second gate; and
   an ESD event detector circuit coupled between said first and second power supply voltage rails, and having first and second output terminals respectively coupled to said first and second gates of said MIGFET, wherein in response to an ESD event between said first and second power supply voltage rails, said ESD event detector circuit provides a voltage to said first gate to adjust a threshold voltage of said MIGFET while providing a voltage to said second gate to make said MIGFET conductive with relatively high conductivity.

2. The rail clamp circuit of claim 1 wherein said MIGFET is formed above a substrate of the integrated circuit.

3. The rail clamp circuit of claim 2 wherein said MIGFET has a vertical channel and current flows horizontally with respect to said substrate.

4. The rail clamp circuit of claim 3 wherein said MIGFET has electrically isolated gate electrode regions on opposite sides of said vertical channel forming said first gate and said second gate.

5. The rail clamp circuit of claim 1 wherein said MIGFET is characterized as being an N-channel MIGFET and said ESD event detector adjusts said threshold voltage by lowering said threshold voltage.

6. The rail clamp circuit of claim 1 wherein said MIGFET is characterized as being an P-channel MIGFET and said ESD event detector adjusts said threshold voltage by raising said threshold voltage.

7. An integrated circuit comprising:
a first power supply voltage rail;
a second power supply voltage rail;
a trigger signal rail;
a VT signal rail;
a plurality of first input/output cells located adjacent to said first and second power supply voltage rails and each having a multiple independent gate field effect transistor (MIGFET) having a source-drain path coupled between said first and second power supply voltage rails, and having first and second gates respectively coupled to said trigger signal rail and said VT signal rail; and
an ESD event detector circuit coupled between said first and second power supply voltage rails, and having first and second output terminals respectively coupled to said trigger signal rail and to said VT signal rail, wherein in response to an electrostatic discharge (ESD) event between said first and second power supply voltage rails, said ESD event detector circuit provides a voltage to said VT signal rail to adjust a threshold voltage of said MIGFET of each of said plurality of first input/output cells while providing a voltage to said trigger signal rail to make said MIGFET conductive with relatively high conductivity.

8. The integrated circuit of claim 7 wherein each of said plurality of first input/output cells comprises a bonding pad.

9. The integrated circuit of claim 8 wherein each of said plurality of first input/output cells further comprises:
a first diode coupled between said bonding pad and said first power supply voltage rail; and
a second diode coupled between said second power supply voltage rail and said bonding pad.

10. The integrated circuit of claim 7 further comprising at least one second input/output cell comprising said ESD event detector circuit.

11. The integrated circuit of claim 10 further comprising a plurality of second input/output cells each comprising an ESD event detector circuit.

12. The integrated circuit of claim 11 wherein said plurality of second input/output cells is interspersed with said plurality of first input/output cells.

13. The integrated circuit of claim 12 wherein said plurality of first input/output cells and said plurality of second input/output cells occur in the ratio of about five to one.

14. The integrated circuit of claim 7 wherein said trigger signal rail is narrower than either said first power supply voltage rail or said second power supply voltage rail.

15. The integrated circuit of claim 7 wherein VT signal rail is narrower than either said first power supply voltage rail or said second power supply voltage rail.

16. A method of protecting an integrated circuit from an electrostatic discharge (ESD) event, comprising the steps of:
coupling a multiple independent gate field effect transistor (MIGFET) between first and second power supply voltage rails;
during normal operation, biasing a first gate of said MIGFET to select a relatively low leakage and biasing a second gate of said MIGFET to make said MIGFET nonconductive with said relatively low leakage; and
during the ESD event, biasing said first gate of said MIGFET to select a relatively high conductivity and biasing said second gate of said MIGFET to make said MIGFET conductive with said relatively high conductivity.

17. The method of claim 16 wherein said step of biasing said first gate of said MIGFET during the ESD event comprises the steps of:
detecting the ESD event; and
triggering said MIGFET to be conductive with said relatively high conductivity in response to said step of detecting.

18. The method of claim 17 wherein said step of triggering said MIGFET comprises the step of:
providing a trigger signal to said first gate of said MIGFET in response to said step of detecting.

19. The method of claim 16 wherein said step of coupling said MIGFET between said first and second power supply voltage rails comprises the step of coupling an N-channel MIGFET between said first and second power supply voltage rails, and said step of biasing said first gate of said MIGFET during the ESD event to select said relatively high conductivity comprises the step of lowering a threshold voltage of said N-channel MIGFET.

20. The method of claim 16 wherein said step of coupling said MIGFET between said first and second power supply voltage rails comprises the step of coupling a P-channel MIGFET between said first and second power supply voltage rails, and said step of biasing said first gate of said MIGFET during the ESD event to select said relatively high conductivity comprises the step of raising a threshold voltage of said P-channel MIGFET.

* * * * *